(12) United States Patent
Aas et al.

(10) Patent No.: US 10,425,299 B2
(45) Date of Patent: *Sep. 24, 2019

(54) QUANTIFYING AND DESIGNING OPTIMAL CONNECTING NETWORKS

(71) Applicant: International Business Machines Corporation, Armonk, NY (US)

(72) Inventors: Cecilia J. Aas, Saffron Walden (GB); Ian Robertson, Cambridge (GB)

(73) Assignee: International Business Machines Corporation, Armonk, NY (US)

( * ) Notice: Subject to any disclaimer, the term of this patent is extended or adjusted under 35 U.S.C. 154(b) by 91 days.

This patent is subject to a terminal disclaimer.

(21) Appl. No.: 14/730,341

(22) Filed: Jun. 4, 2015

(65) Prior Publication Data

US 2016/0359726 A1    Dec. 8, 2016

(51) Int. Cl.
*H04L 12/26* (2006.01)
*G06F 17/10* (2006.01)
*G06F 17/50* (2006.01)

(52) U.S. Cl.
CPC ............ *H04L 43/045* (2013.01); *G06F 17/10* (2013.01); *G06F 17/50* (2013.01)

(58) Field of Classification Search
CPC .................................. H04L 45/00; H04L 47/10
See application file for complete search history.

(56) References Cited

U.S. PATENT DOCUMENTS

| | | |
|---|---|---|
| 8,145,588 B2 | 3/2012 | Becker |
| 8,364,717 B2 | 1/2013 | Delling et al. |
| 8,527,503 B2 | 9/2013 | Tretjakov et al. |
| 8,577,663 B2 | 11/2013 | Lu et al. |
| 8,818,918 B2 | 8/2014 | Lin et al. |

(Continued)

FOREIGN PATENT DOCUMENTS

GB    2505443 A    3/2014

OTHER PUBLICATIONS

Aas et al., "Quantifying and Designing Optimal Connecting Networks", U.S. Appl. No. 15/196,481, filed Jun. 29, 2016, 26 pages.

(Continued)

*Primary Examiner* — Samina F Choudhry
(74) *Attorney, Agent, or Firm* — Gilbert Harmon, Jr.

(57) ABSTRACT

A method for optimizing network design includes identifying a set of terminal-to-terminal shortest paths in a network, wherein a terminal-to-terminal shortest path is a best connection between two terminals, evaluating a terminal betweenness for each non-terminal vertex in the network, wherein the terminal betweenness of a vertex is a fraction of the total number of terminal-to-terminal shortest paths that include said vertex, calculating an average terminal betweenness for each terminal-to-terminal shortest path based on the terminal betweenness of the vertices in the path, iteratively adding the terminal-to-terminal shortest paths to an output graph in order of decreasing average terminal betweenness until all terminals are represented on the output graph, and using the output graph to design or adjust a network. The method may also include displaying the output graph to a user. A computer program product and computer system corresponding to the method are also disclosed.

13 Claims, 6 Drawing Sheets

(56) References Cited

U.S. PATENT DOCUMENTS

| | | | | |
|---|---|---|---|---|
| 2004/0004938 A1* | 1/2004 | Buddhikot | ............. | H04L 45/12 370/238 |
| 2012/0278261 A1* | 11/2012 | Lin | ........................ | G06N 5/003 706/12 |
| 2013/0339290 A1* | 12/2013 | Lee | ........................ | G06F 17/10 706/55 |

OTHER PUBLICATIONS

IBM Appendix P, list of patents and patent applications treated as related, Jun. 29, 2016, 2 pages.

Bresar et al., "Steiner intervals, geodesic intervals, and betweenness", Discrete Mathematics 309 (2009), pp. 6114-6125, Available online Jun. 11, 2009, © 2009 Elsevier B.V., doi: 10.1016/j.disc.2009.05.022.

IBM, "IBM i2 Intelligence Analysis delivers product enhancements, improves cross-product compatibility, and extends national language availability", IBM United States Software Announcement 215-038, dated Mar. 10, 2015, pp. 1-12, IBM®, "Grace Period Disclosure".

Khopkar et al., "Efficient algorithms for incremental all pairs shortest paths, closeness and betweenness in social network analysis", Soc. Netw. Anal. Min. (2014) 4:220, DOI 10.1007/s13278-014-0220-6, Published on-line: Aug. 3, 2014, pp. 1-20, © Springer-Verlag Wien 2014.

Kourtellis et al., "Identifying high betweenness centrality nodes in large social networks", Soc. Netw. Anal. Min. (2013) 3:899-914, DOI 10.1007/s13278-012-0076-6, Published on-line: Jul. 5, 2012, pp. 899-914, © Springer-Verlag 2012.

* cited by examiner

| Vertex | Terminal Betweenness |
|---|---|
| 320E | 6/7 |
| 320D | 4/7 |
| 320C | 1/7 |
| 320B | 1/7 |
| 320A | 4/7 |

| Path | Average Terminal Betweenness | Rank |
|---|---|---|
| 310A-320A-320B-320C-320D-310B | 0.357 | 4 |
| 310A-320A-320E-320D-310B | 0.667 | 3 |
| 310A-320A-320E-310C | 0.714 | 2 |
| 310A-320A-320E-310D | 0.714 | 2 |
| 310B-320D-320E-310C | 0.714 | 2 |
| 310B-320D-320E-310D | 0.714 | 2 |
| 310C-320E-310D | 0.857 | 1 |

QUANTIFYING AND DESIGNING OPTIMAL CONNECTING NETWORKS

STATEMENT REGARDING PRIOR DISCLOSURES BY THE INVENTOR OR A JOINT INVENTOR

The following disclosure(s) are submitted under 35 U.S.C. 102(b)(1)(A) as prior disclosures by, or on behalf of, a sole inventor of the present application or a joint inventor of the present application:

(1) IBM, "IBM i2 Intelligence Analysis delivers product enhancements, improves cross-product compatibility, and extends national language availability", IBM United States Software Announcement 215-038, dated Mar. 10, 2015, pages 1-12, IBM®, "Grace Period Disclosure".

BACKGROUND OF THE INVENTION

The present invention relates generally to the field of network design, and more specifically to optimizing connections between a set of resources.

In intelligence analysis, resource analysis, traffic management, logistics, and many other network related areas of analysis, it is common to connect a set of resources, or terminals, in an "optimal" way. This is typically achieved by evaluating a minimal Steiner tree on the network, which is the shortest possible tree on the network which connects the terminals of interest. In some cases, algorithms used to evaluate the minimal Steiner tree are heuristic algorithms coupled with pre-processing and branching techniques.

SUMMARY

As disclosed herein, a method for optimizing network design includes identifying a set of terminal-to-terminal shortest paths in a network, wherein a terminal-to-terminal shortest path is a best connection between two terminals, evaluating a terminal betweenness for each non-terminal vertex in the network, wherein the terminal betweenness of a vertex is a fraction of the total number of terminal-to-terminal shortest paths that include said vertex, calculating an average terminal betweenness for each terminal-to-terminal shortest path based on the terminal betweenness of the vertices in the path, iteratively adding the terminal-to-terminal shortest paths to an output graph in order of decreasing average terminal betweenness until all terminals are represented on the output graph, and using the output graph to design or adjust a network structure. A computer program product and computer system corresponding to the method are also included.

DETAILED DESCRIPTION

Typical heuristic Steiner tree algorithms pose a number of problems. The output network they produce is often dependent on some sub-sampling of the network. This sub-sampling can lead to an incomplete representation of the Steiner tree. Further, structurally equivalent vertices or edges in the network can lead the algorithm to pick parts of different Steiner trees instead of picking one complete Steiner tree. Lastly, it may be beneficial to view information from multiple Steiner trees as opposed to just one, which the current algorithms cannot provide with consistency. More generally, these heuristic algorithms yield approximate results that may be neither guaranteed to be accurate nor repeatable.

In this disclosure, a procedure is proposed to evaluate network structure in an exact and repeatable way that outputs a network structure which connects terminal vertices (i.e., the vertices of interest) through a network of "best" non-terminal vertices, wherein the "best" non-terminal vertices are vertices of high connectivity with respect to the terminal vertices. The method also provides a ranking of each terminal-to-terminal shortest path on the output network structure, describing how useful each pair-wise shortest path is in connecting all the terminals, not just the terminals at either end of the shortest path.

Figure 1:
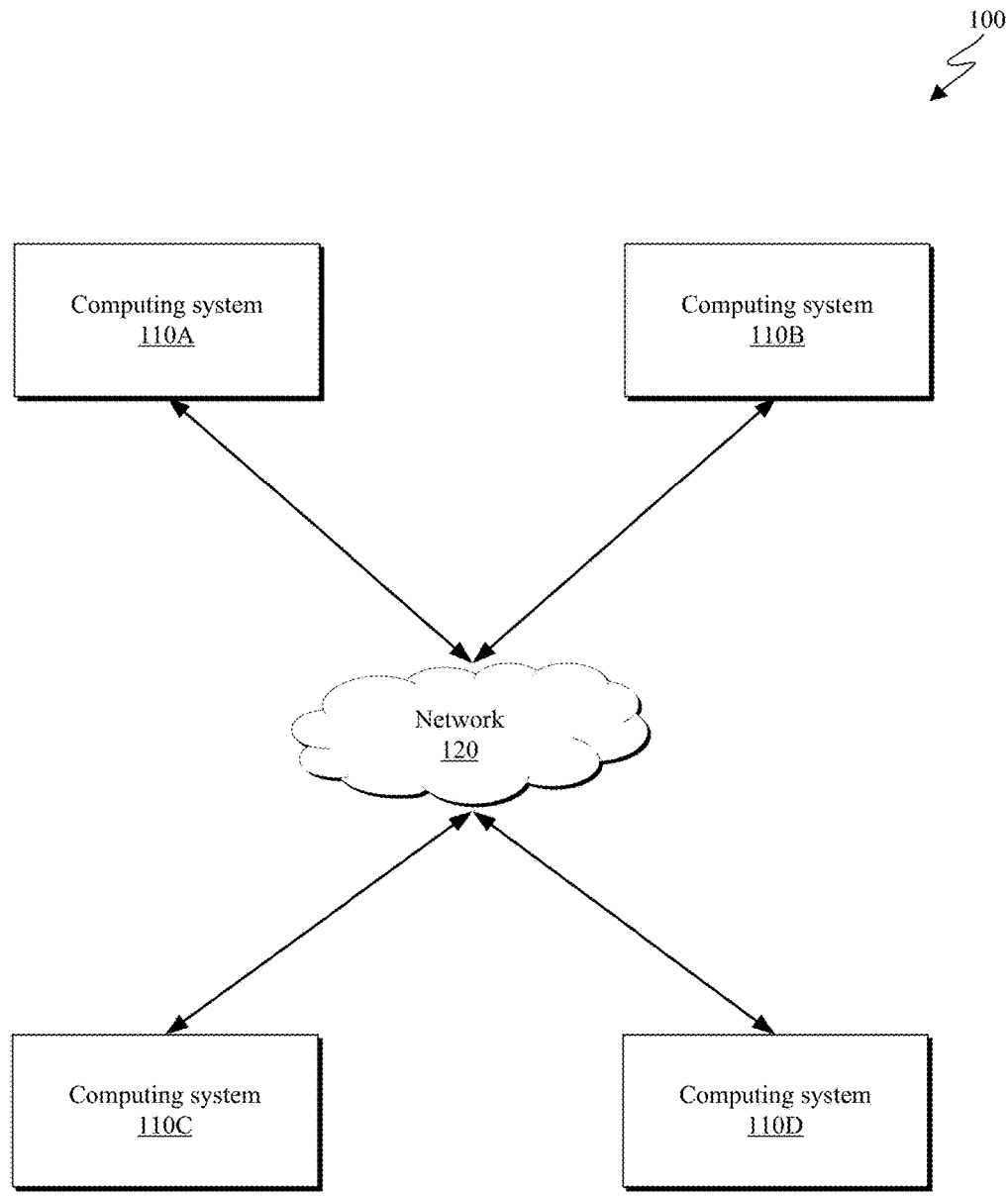
FIG. 1 is a functional block diagram depicting a computing environment in accordance with some embodiments of the present invention.

FIG. 1 is a functional block diagram depicting a computing environment 100 in accordance with some embodiments of the present invention. As depicted, the computing environment 100 includes four nodes 110A, 110B, 110C, and 110D, connected to one another via a network 120. Computing environment 100 may correspond to a resource analysis system.

Nodes 110A, 110B, 110C, and 110D may each be either data communication equipment, such as a modem, hub, bridge, or switch, or data terminal equipment such as a digital telephone handset, a printer, a router, a workstation, or a server. In some embodiments, nodes 110A, 110B, 110C, and 110D can be desktop computers, laptop computers, specialized computer servers, or any other computer systems known in the art. In some embodiments, nodes 110A, 110B, 110C, and 110D represent computer systems utilizing clustered computers and components to act as a single pool of seamless resources when accessed through network 120. In general, nodes 110A, 110B, 110C, and 110D may be representative of any electronic devices, or combination of electronic devices, capable of executing machine-readable program instructions, as described in greater detail with regard to FIG. 6.

Network 120 can be, for example, a local area network (LAN), a wide area network (WAN) such as the Internet, or a combination of the two, and include wired, wireless, or fiber optic connections. In general, network 120 can be any combination of connections and protocols that will support communications between nodes 110A, 110B, 110C, and 110D in accordance with an embodiment of the present invention.

Figure 2:
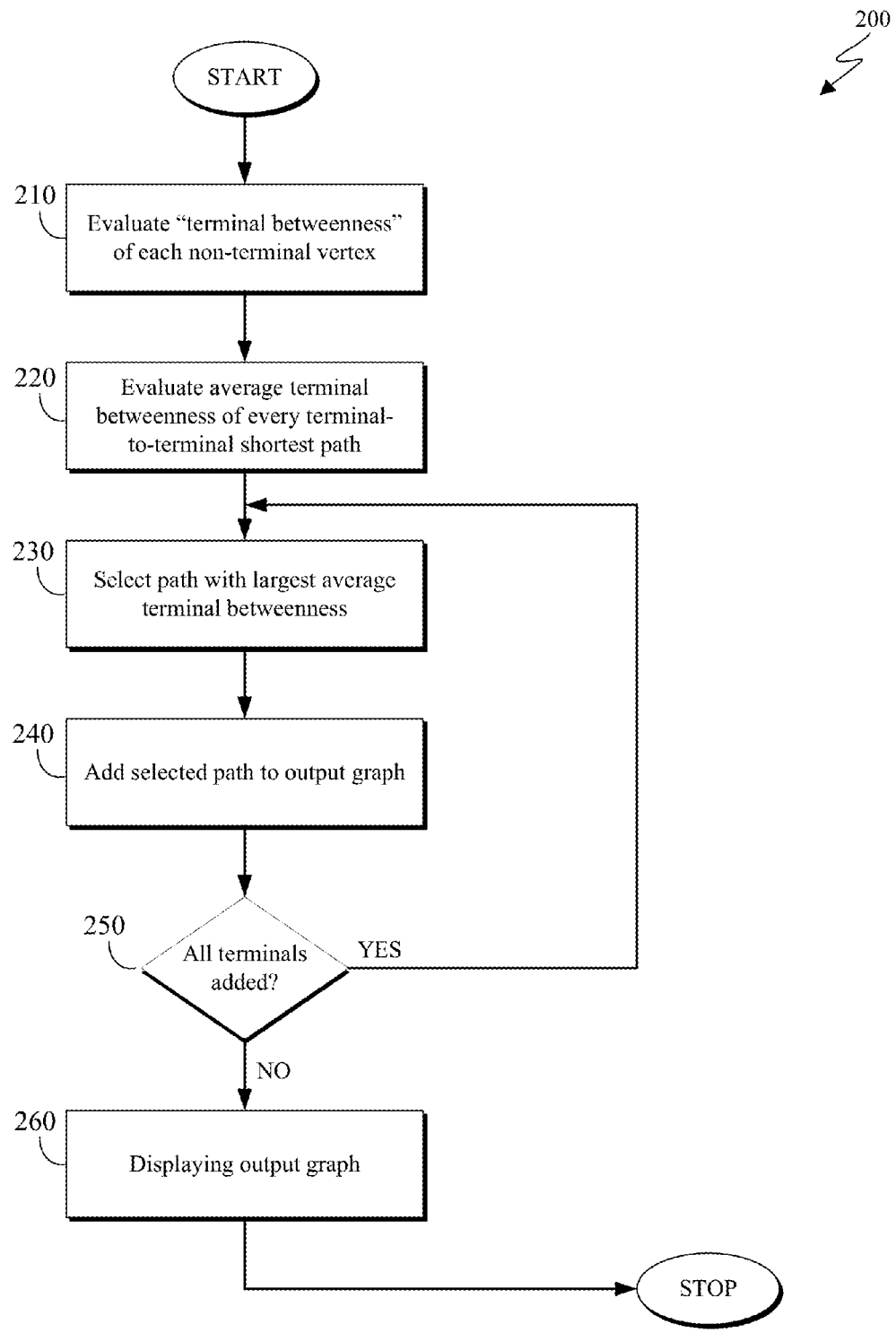
FIG. 2 is a flowchart depicting a network design optimization method in accordance with some embodiments of the present invention.

FIG. 2 is a flowchart depicting a network design optimization method 200 in accordance with some embodiments of the present invention. As depicted, the network design optimization method 200 includes evaluating (210) the "terminal betweenness" of each non-terminal vertex, calculating (220) the average terminal betweenness of every terminal-to-terminal shortest path, selecting (230) a path (or a group of paths) with the largest average terminal betweenness, adding (240) the selected path (or group of paths) to an output graph, determining (250) if all the terminals are on the output graph, and displaying (260) the output graph. Network design optimization method 200 may enable improved accuracy when evaluating networks.

Evaluating (210) the "terminal betweenness" of each non-terminal vertex may include determining the fraction of all terminal-to-terminal shortest paths that go through said non-terminal vertex. A shortest path in this case refers to a path, identified using existing algorithms, that provides the best connection between any given pair of vertices. Therefore, determining the fraction of terminal-to-terminal shortest paths that go through a non-terminal vertex may include dividing the number of terminal-to-terminal shortest paths that include the non-terminal vertex by the total number of terminal-to-terminal shortest paths in the network. Terminal betweenness therefore represents what percentage of the terminal pairs in the network are optimally connected via the corresponding vertex. In one embodiment, terminal betweenness is evaluated for links between vertices, also called edges, as opposed to for the vertices themselves.

Calculating (220) the average terminal betweenness of every terminal-to-terminal shortest path may include identifying each vertex utilized in a terminal-to-terminal shortest path. The terminal betweennesses corresponding to the identified vertices are then averaged to yield the average terminal betweenness corresponding to the terminal-to-terminal shortest path. For a path p comprising vertices $T_{start}$, $V_0, V_1, \ldots, V_{n-1}, V_n, T_{end}$, the average vertex terminal betweenness $B_v(P)$ may be calculated according to the equation: $B_v(P)=(B(V_i))$ sum from i=0 to i=n)/n, where $B(V_i)$ denotes the terminal betweenness of vertex $V_i$. The average terminal betweenness is calculated for each terminal-to-terminal shortest path in the network. In one embodiment, an edgewise average terminal betweenness is calculated for the edges in the network as opposed to for the vertices.

Selecting (230) a remaining terminal-to-terminal shortest path with the largest average terminal betweenness may include identifying the terminal-to-terminal shortest path with the largest average terminal betweenness. Since terminal betweenness is representative of the percentage of terminal pairs in the network that are optimally connected via a vertex, selecting a terminal-to-terminal shortest path with the largest average terminal betweenness essentially entails selecting the path that contains vertices that are most globally useful in connecting the terminals.

Adding (240) the selected path to an output graph may include placing the vertices and edges contained in the path on a visual display such as a graph. By performing multiple iterations of the selection and addition steps in order of descending average terminal betweenness, the paths containing the most globally useful vertices are added first. Therefore, a graph containing all the terminals in the network may be produced before all paths are added.

Determining (250) if all terminals are on the output graph may include checking the output graph for all the terminals that exist in the network. Determining if all terminals are on the output graph may include verifying the presence of each terminal on the output graph. If it is determined that all terminals are indeed on the output graph, the method continues by displaying (260) the output graph. If it is determined that all terminals are not on the output graph, the method continues by selecting (230) a path (or a group of paths) with the largest average terminal betweenness from the remaining terminal-to-terminal shortest paths.

Displaying (260) the output graph may include providing the produced output graph to a user or a computing system. In one embodiment, the output graph is provided to a system configured to edit the input (or original) network appropriately.

Figure 3A:
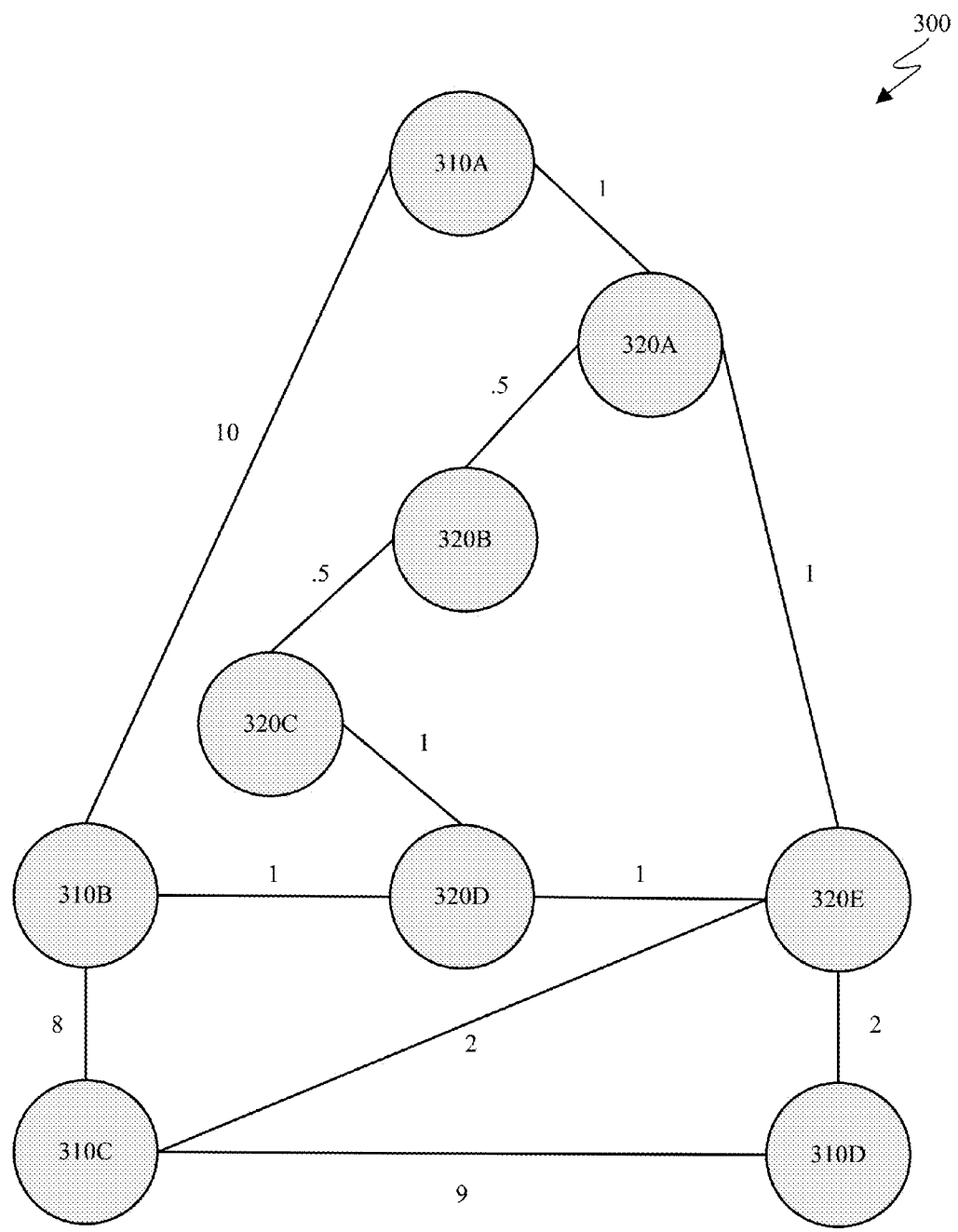
FIG. 3A is a node diagram depicting an example of an input network in accordance with one embodiment of the present invention.

FIG. 3A is a node diagram depicting an example of an input network 300 in accordance with one embodiment of the present invention. As depicted, input network 300 includes four terminals 310A, 310B, 310C, 310D and five other vertices 320A, 320B, 320C, 320D, and 320E. The four terminals 310A, 310B, 310C and 310D could correspond to resources that need to be connected via the network 300. The length of each connection between each pair of nodes is labeled. Network 300 represents a network that could be analyzed and optimized using network design optimization method 200.

The terminal-to-terminal shortest paths in the depicted network 300, described with respect to the vertices they pass through, are 310A-320A-320B-320C-320D-310B, 310A-320A-320E-320D-310B, 310A-320A-320E-310C, 310A-320A-320E-310D, 310B-320D-320E-310C, 310B-320D-320E-310D, and 310C-320E-310D. The terminal betweenness of each vertex is depicted in the chart in FIG. 3B.

Figures 3B, 3C, 3D:
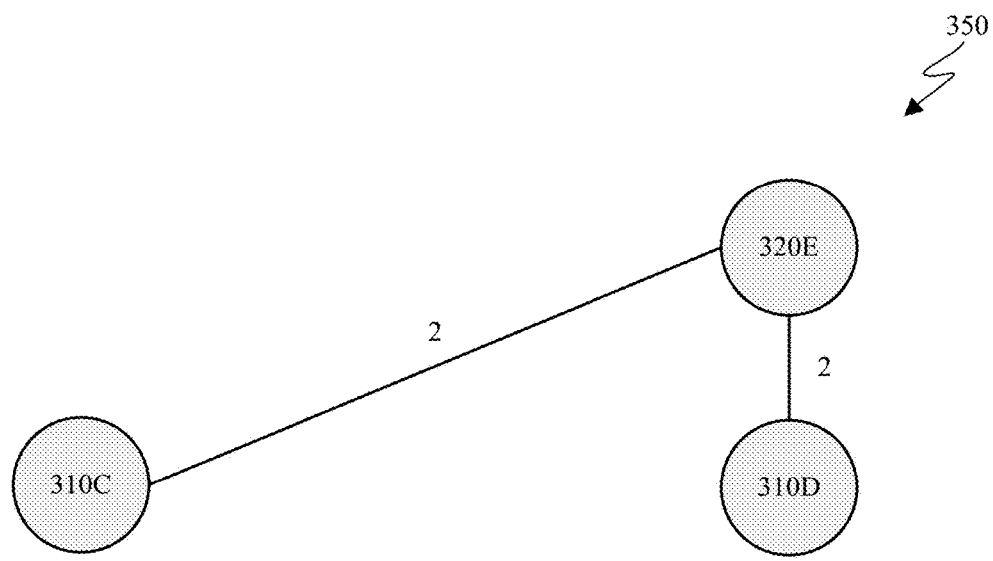
FIG. 3B is a chart depicting the terminal betweenness of each non-terminal vertex in a network in accordance with one embodiment of the present invention.
FIG. 3C is a chart depicting the average terminal betweenness of each shortest path in a network in accordance with one embodiment of the present invention.
FIG. 3D is a node diagram depicting an example of a partial output network after a first iteration of a network optimization method in accordance with one embodiment of the present invention.

FIG. 3B is a chart depicting the terminal betweenness of each vertex in network 300. As depicted, vertex 320E has the highest terminal betweenness, vertex 320A and vertex 320D are next highest, and vertex 320B and vertex 320C have the lowest terminal betweenness. The terminal betweenness is calculated by taking the number of terminal-to-terminal shortest paths a vertex, such as vertex 320E, is utilized in (6 in the case of vertex 320E), and dividing that number by the total number of terminal-to-terminal shortest paths (7 for depicted network 300). These values are used to then calculate the average terminal betweenness for each terminal-to-terminal shortest path in network 300 as depicted in the chart in FIG. 3C.

FIG. 3C is a chart depicting the average terminal betweenness of each terminal-to-terminal shortest path in network 300. As depicted, path 310C-320E-310D has the highest average terminal betweenness, with a cluster of four paths (310A-320A-320E-310C, 310A-320A-320E-310D, 310B-320D-320E-310C, 310B-320D-320E-310D) all equal with the second highest average terminal betweenness. The average terminal betweenness for path 310B-320D-320E-310D is calculated by taking the average of the terminal betweenness of the non-terminal vertices, which in this case are 320D and 320E. Therefore, the average terminal betweenness for the path is $((6/7)+(4/7))/2=0.714$.

FIG. 3D is a network diagram depicting an example of a partial output network 350 after a first iteration of a network optimization method in accordance with one embodiment of the present invention. As depicted, partial output network 350 includes two terminal vertices 310C and 310D, as well as a non-terminal vertex 320E. The links between the vertices are also depicted along with their length. Partial output network 350 is an example of what may be shown on an output graph after a first iteration of network design optimization method 200 is executed with respect to network 300 depicted in FIG. 3A.

In accordance with network design optimization method 200, the path with the highest average terminal betweenness has been added to the output graph first. In this embodiment, path 310C-320E-310D has the highest average terminal betwenness, and is therefore added to the output graph. The graph is then checked to determine whether all terminals are present. Since terminals 310A and 310B are not exhibited in partial output network 350 on the output graph, more paths must be added to the output graph.

Figure 3E:
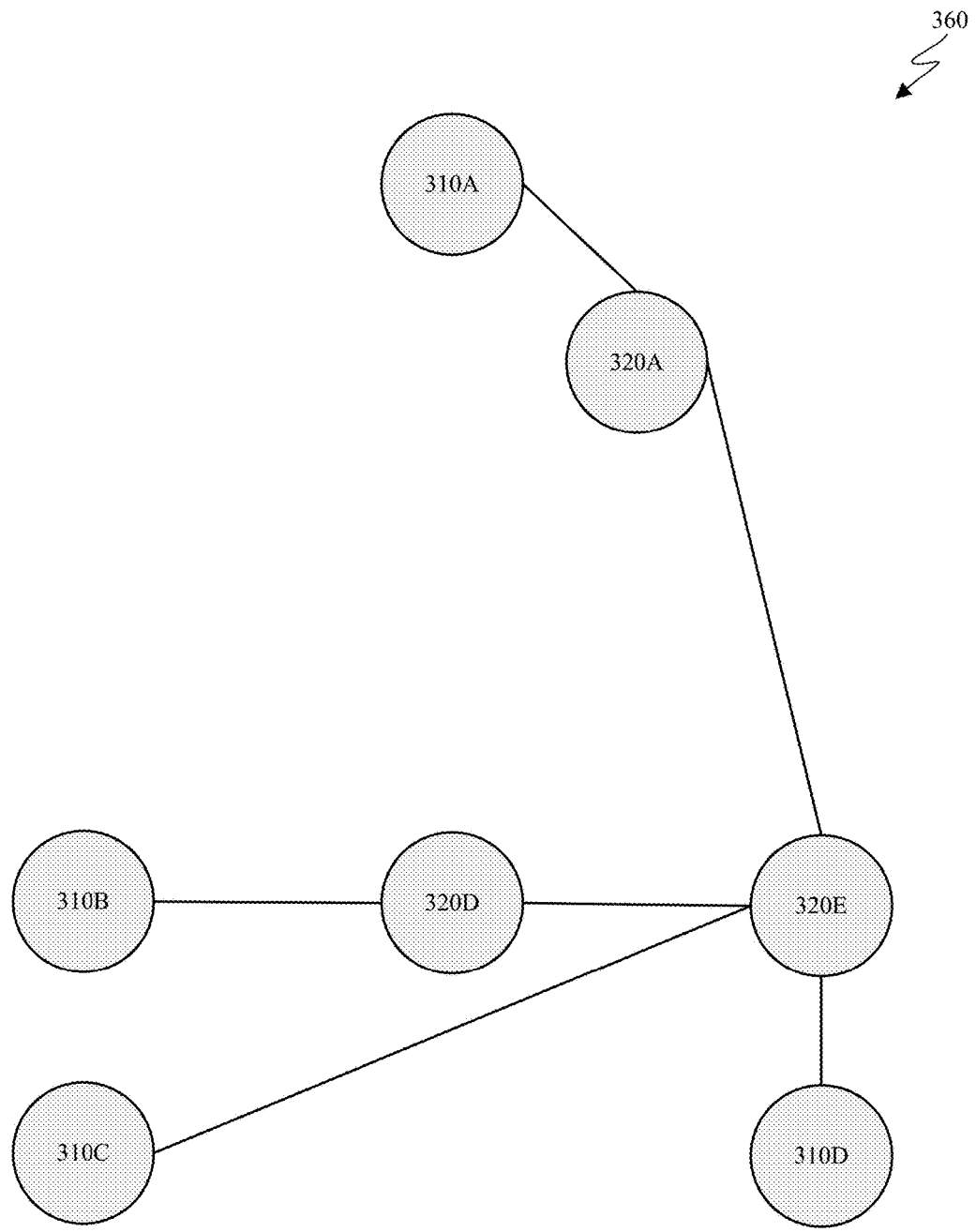
FIG. 3E is a node diagram depicting an example of an optimized output network after a second iteration of a network optimization method in accordance with one embodiment of the present invention.

FIG. 3E is a node diagram depicting an example of an optimized output network 360 after a second iteration of a network optimization method in accordance with one embodiment of the present invention. As depicted, optimized output network 360 includes four terminals 310A, 310B, 310C, and 310D, as well as three other vertices 320A, 320E, and 320D. The connections between the vertices are also depicted along with their length. Optimized output network 360 is an example of what may be shown on an output graph after a second iteration of network design optimization method 200 is executed with respect to network 300 depicted in FIG. 3A.

In accordance with network design optimization method 200, the remaining path with the highest average terminal betweenness is added to the output graph next. Since there are four paths (310A-320A-320E-310C, 310A-320A-320E-310D, 310B-320D-320E-310C, 310B-320D-320E-310D) with equal average terminal betweenness, all four are added to the output graph. The graph is then checked to determine whether all terminals are present. Since all terminals are present, the output graph is complete and can be presented as is.

Figure 4:
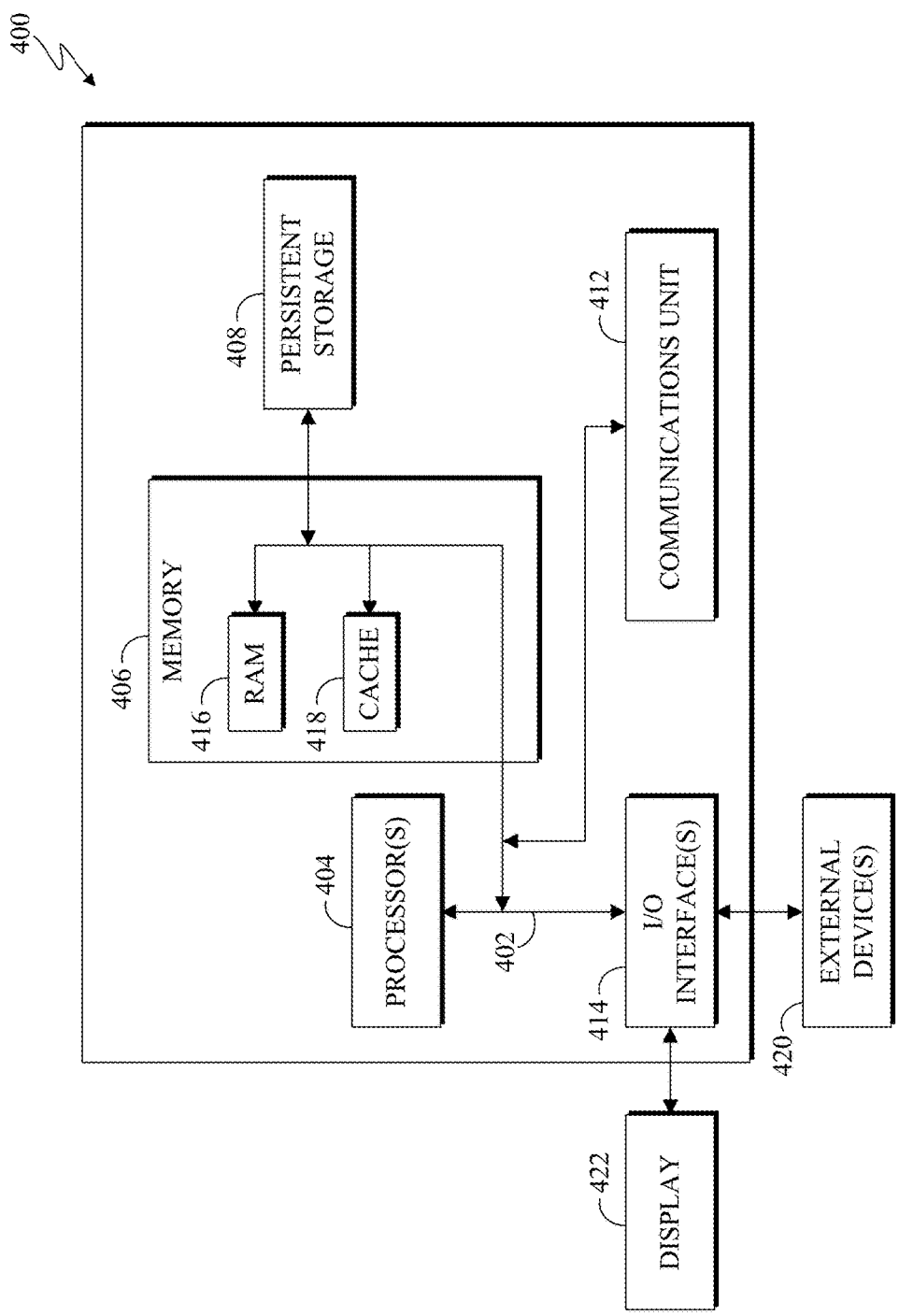
FIG. 4 depicts a block diagram of components of a computer, in accordance with some embodiments of the present invention.

FIG. 4 depicts a block diagram of components of computer 400 in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

As depicted, the computer 400 includes communications fabric 402, which provides communications between computer processor(s) 404, memory 406, persistent storage 408, communications unit 412, and input/output (I/O) interface(s) 414. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In this embodiment, memory 406 includes random access memory (RAM) 416 and cache memory 418. In general, memory 406 can include any suitable volatile or non-volatile computer-readable storage media.

One or more programs may be stored in persistent storage 408 for access and/or execution by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 412, in these examples, provides for communications with other data processing systems or devices. In these examples, communications unit 412 includes one or more network interface cards. Communications unit 412 may provide communications through the use of either or both physical and wireless communications links.

I/O interface(s) 414 allows for input and output of data with other devices that may be connected to computer 400. For example, I/O interface 414 may provide a connection to external devices 420 such as a keyboard, keypad, a touch screen, and/or some other suitable input device. External devices 420 can also include portable computer-readable storage media such as, for example, thumb drives, portable optical or magnetic disks, and memory cards. Software and data used to practice embodiments of the present invention can be stored on such portable computer-readable storage media and can be loaded onto persistent storage 408 via I/O interface(s) 414. I/O interface(s) 414 also connect to a display 422.

Display 422 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A computer program product for optimizing network design, the computer program product comprising:
one or more computer readable storage media that are not transitory signals per se and program instructions stored on the one or more computer readable storage media, the program instructions comprising instructions to:
identify a set of terminal-to-terminal shortest paths in a network, wherein a terminal-to-terminal shortest path is a best connection between two terminals;
identify a first quantity of terminal-to-terminal shortest paths that pass through one or more non-terminal vertices in the network;
for each non-terminal vertex in the network, determine a terminal betweenness for the non-terminal vertex by identifying a second quantity of shortest paths that pass through the non-terminal vertex, and dividing the second quantity of shortest paths by the first quantity;

calculate an average terminal betweenness for each terminal-to-terminal shortest path based on the terminal betweennesses of the vertices in the path;

iteratively add the terminal-to-terminal shortest paths to an output graph in order of decreasing average terminal betweenness until each terminal in the network is represented on the output graph, wherein adding a terminal-to-terminal shortest path to an output graph includes adding the terminals and non-terminal vertices included in said terminal-to-terminal shortest path to the output graph; and repair or create a network according to the output graph.

2. The computer program product of claim 1, further comprising instructions to:

display the output graph to a user.

3. The computer program product of claim 1, further comprising instructions to:

evaluate an edgewise terminal betweenness for each edge in the network;

calculate an average edgewise terminal betweenness for each terminal-to-terminal shortest based on the terminal betweenness of the edges in the path; and iteratively add the terminal-to-terminal shortest paths to an output graph in order of decreasing average edgewise terminal betweenness until all terminals are represented on the output graph.

4. The computer program product of claim 1, wherein program instructions to identify a set of terminal-to-terminal shortest paths in a network comprise instructions to:

use an algorithm to identify a set of terminal-to-terminal shortest paths.

5. The computer program product of claim 1, further comprising instructions to:

rank the terminal-to-terminal shortest paths from highest average terminal betweenness to lowest average terminal betweenness; and iteratively add the terminal-to-terminal shortest paths to an output graph in order of ranking until all terminals are represented on the output graph.

6. The computer program product of claim 1, further comprising instructions to:

verify that all terminals are depicted on the output graph.

7. The computer program product of claim 1, wherein program instructions to use the output graph to design or adjust a network comprise instructions to create a network based on the network depicted on the output graph.

8. A computer system for optimizing network design, the computer system comprising:

one or more computer processors;

one or more computer-readable storage media that are not transitory signals per se;

program instructions stored on the computer-readable storage media for execution by at least one of the one or more processors, the program instructions comprising instructions to:

identify a set of terminal-to-terminal shortest paths in a network, wherein a terminal-to-terminal shortest path is a best connection between two terminals;

identify a first quantity of terminal-to-terminal shortest paths that pass through one or more non-terminal vertices in the network;

for each non-terminal vertex in the network, determine a terminal betweenness for the non-terminal vertex by identifying a second quantity of shortest paths that pass through the non-terminal vertex, and dividing the second quantity of shortest paths by the first quantity;

calculate an average terminal betweenness for each terminal-to-terminal shortest path based on the terminal betweennesses of the vertices in the path;

iteratively add the terminal-to-terminal shortest paths to an output graph in order of decreasing average terminal betweenness until each terminal in the network is represented on the output graph, wherein adding a terminal-to-terminal shortest path to an output graph includes adding the terminals and non-terminal vertices included in said terminal-to-terminal shortest path to the output graph; and repair or create a network according to the output graph.

9. The computer system of claim 8, further comprising instructions to:

display the output graph to a user.

10. The computer system of claim 8, further comprising instructions to:

evaluate an edgewise terminal betweenness for each edge in the network;

calculate an average edgewise terminal betweenness for each terminal-to-terminal shortest path based on the terminal betweenness of the edges in the path; and iteratively add the terminal-to-terminal shortest paths to an output graph in order of decreasing average edgewise terminal betweenness until all terminals are represented on the output graph.

11. The computer system of claim 8, wherein program instructions to identify a set of terminal-to-terminal shortest paths in a network comprise instructions to:

use an algorithm to identify a set of best connections between terminal vertices.

12. The computer system of claim 8, further comprising instructions to:

rank the terminal-to-terminal shortest paths from highest average terminal betweenness to lowest average terminal betweenness; and iteratively add the terminal-to-terminal shortest paths to an output graph in order of ranking until all terminals are represented on the output graph.

13. The computer system of claim 8, further comprising instructions to:

verify that all terminals are depicted on the output graph.

* * * * *